United States Patent [19]
Okamoto

[11] Patent Number: 5,767,801
[45] Date of Patent: Jun. 16, 1998

[54] LINEAR TYPE DIGITAL-TO-ANALOG CONVERTER AND DRIVING METHOD THEREFOR

[75] Inventor: Seiji Okamoto, Tokyo, Japan

[73] Assignee: Oki Electric Industry Co., Ltd., Tokyo, Japan

[21] Appl. No.: 790,756

[22] Filed: Jan. 27, 1997

[30] Foreign Application Priority Data

Jun. 24, 1996 [JP] Japan ................................ 8-163258

[51] Int. Cl.$^6$ .................................................. H03M 1/68
[52] U.S. Cl. ........................................................ 341/145
[58] Field of Search .................................... 341/145, 144, 341/53, 141, 151

[56] References Cited

U.S. PATENT DOCUMENTS 4,568,917  2/1986  McKenzie et al.
5,572,211  11/1996  Erhart et al. ........................ 341/144

FOREIGN PATENT DOCUMENTS 57-124933  8/1982  Japan .
58-148515  9/1983  Japan .
60-37830   2/1985  Japan .
60-236329  11/1985  Japan .

*Primary Examiner*—Brian K. Young
*Attorney, Agent, or Firm*—Spencer & Frank

[57] ABSTRACT

The present invention aims to provide a linear type digital-to-analog converter which has a great freedom of design and then is not affected by a parasitic capacity. The linear type digital-to-analog converter comprises a lower digital-to-analog converting portion having a plurality of lower serial circuits connected in a ladder manner between a lower output line, and an earthed line and a reference voltage line, the lower serial circuit comprising a lower capacitor and a lower transfer type switch, and a weighted second capacitor connected between the lower output line and the earthed line, an upper digital-to-analog converting portion having a plurality of upper serial circuits connected in a ladder manner between an upper output line, and the earthed line and the reference voltage line, the upper serial circuit comprising an upper capacitor and an upper transfer type switch, and the lower output line and the upper output line are connected through a coupling capacitor. A buffer amplifier is disposed between the lower output line and the coupling capacitor.

5 Claims, 3 Drawing Sheets

5,767,801

1

LINEAR TYPE DIGITAL-TO-ANALOG CONVERTER AND DRIVING METHOD THEREFOR

BACKGROUND OF THE INVENTION

1. Field of the Invention

The present invention relates to a linear type digital-to-analog converter and a driving method therefor.

2. Description of the Related Art

There is disclosed in Japanese Patent Application Laid Open (Kokai) No. 57-124933 (hereinafter referred to as "the document I") a conventional linear type digital-to-analog converter. The converter is hereinafter referred to as a "DA converter". The cicuit construction of DA converter will be described in detail hereinbelow with reference to FIG. 3.

A conventional DA converter 50 has a lower DA converter (hereinafter referred to as "the L-DAC 52") and an upper DA converter (hereinafter referred to as "the M-DAC 54").

Also, the L-DAC 52 is comprised of a plurality of lower serial circuits 65a connected in a ladder manner between a lower output line 56a, and an earthed line 58 and a reference voltage line 60. The lower serial circuits 65a each is comprised of a lower capacitor 62a having a weighted capacity, and a lower transfer type switch 64a. Meanwhile, the M-DAC 54 is comprised of a plurality of upper serial circuits 65b connected in a ladder manner between an upper output line 56b, and the earthed line 58 and the reference voltage line 60. The upper serial circuit 65b each is comprised of an upper capacitor 62b having a weighted capacity, and an upper transfer type switch 64b. Further, the lower output line 56a and the upper output line 56b are connected to each other through a coupling capacitor 66.

A digital signal ("0" or "1") is supplied to the lower and upper transfer type switches 64a, 64b through a digital signal input terminal 68. The upper output line 56b is connected to an analog output terminal 72 through a buffer amplifier 70.

Such a conventional DA converter 50 has an advantage that a linear characteristic of the DA converter 50 between input and output signals is made satisfactory in a case where the capacitor, e.g., C7, which has the minimum capacity, within a row of the capacitors constituting the L-DAC 52 is made identical in capacity with the capacitor, e.g., C3, which has the minimum capacity, within a row of the capacitors constituting the M-DAC 54.

However, if the DA converter 50 disclosed in the above-mentioned document I has a parasitic capacity on the lower output line 56a of the L-DAC 52 and the upper output line 56b of the M-DAC 54, e.g., a capacity generated between the wiring and the base board, a junction capacity generated between the elements which are connected in a p-n junction manner, there is caused a problem that an error is generated in an analog voltage outputted from the upper output line 56b of the M-DAC 54, so that the linearity of the analog voltage is eliminated compared with the input digital signal. Therefore, in particular, this DA converter 50 cannot be applied to the digital-to-analog converter which is required to have the high resolution.

Next, the problems existing in the conventional DA converter will be described hereinbelow with reference to FIG. 3. FIG. 3 is a view showing an example of the 6-bits type DA converter.

The output voltage Vout of the conventional DA converter is calculated by the use of the following equation (1):

2

$$V_{out} = \frac{(C1 \times S1 + C2 \times S2 + C3 \times S3)}{C1 + C2 + C3 + CTL} \times V_{ref} + \quad (1)$$

$$\frac{C4}{C1 + C2 + C3 + C4} \times \frac{(C5 \times S4 + C6 \times S5 + C7 \times S6)}{C5 + C6 + C7 + CTM} \times V_{ref}$$

where $V_{ref}$ represents a reference voltage (V).

C1 to C3 each a capacity (F) of the weighted upper capacitor (C1 has four times the capacity of C3, and C2 twice the capacity of C3), C5 to C6 each a capacity (F) of the weighted lower capacitor (C5 has four times the capacity of C7, and C6 twice the capacity of C7), S1 to S6 each a value of "0" or "1" corresponding to the input digital signal.

CTL a value of the equivalent capacity of the L-DAC 52 relative to the output of the M-DAC 54, which is represented by the following equation:

$$CTL = \frac{C4(C5 + C6 + C7)}{C4 + (C5 + C6 + C7)} \quad \text{and}$$

CTM a value of the equivalent capacity of the M-DAC 54 relative to the output of the L-DAC 52, which is represented by the following equation:

$$CTM = \frac{C4(C1 + C2 + C3 + C4)}{C4 + (C1 + C2 + C3)}$$

The first term on the right side of the equation (1) represents the output of the M-DAC 54 and the second term thereon represents the output of the L-DAC 52.

As understood from the equation (1), the output voltage of the M-DAC 54 is affected by serial capacitors comprised of the capacity (C4) of the coupling capacitor 66 connecting the M-DAC 54 and the L-DAC 52, and the total capacity of the L-DAC 52. The output voltage of the L-DAC 52 is affected by serial capacities comprised of the capacity (C4) of the coupling capacitor 66 connecting the M-DAC 54 and the L-DAC 52, and the total capacity of the M-DAC 54. Supposed that the capacity per unit area of the capacities is referred to as "unit capacity", then the capacities C3, C4, and C7 each has the unit capacity, the equation (1) is represented by the use of the following equation (2):

$$V_{out} = \frac{1}{63}\{(4 \times S1 + 2 \times S2 + 1 \times S3) + \frac{1}{8}(4 \times S4 + 2 \times S5 + 1 \times S6)\} \times V_{ref} \quad (2)$$

In the equation (2), the L-DAC 52 has ⅛ times the step size of the M-DAC 54, and the change of the analog output voltage thereof is linear to the input digital signal.

Next, supposed that the capacities C3 and C4 each has one unit capacity and the capacity C7 has two unit capacities, the equation (1) is represented by the use of the following equation (3):

$$V_{out} = \frac{15}{119}\{(4 \times S1 + 2 \times S2 + 1 \times S3) + \frac{1}{15}(8 \times S4 + 2 \times S5 + 1 \times S6)\} \times V_{ref} \quad (3)$$

In the equation (3), the L-DAC 52 has 2/15 times the step size of the M-DAC 54, and the change of the analog output voltage thereof is not linear to the input digital signal. Therefore, if the L-DAC 52 is different in unit capacity from the M-DAC 54, the waveform of the analog voltage is distorted.

Next, the output voltage exhibited if the lower output line 56a of the L-DAC 52 and the upper output line 56b of the M-DAC 54 each has a parasitic capacity (including the capacity generated between the wiring and the base board, in addition to the junction capacity), is calculated by the use of the following equation (4):

$$V_{out} = \frac{(C1 \times S1 + C2 \times S2 + C3 \times S3)}{C1 + C2 + C3 + CTL' + CpM} \times V_{ref} + \quad (4)$$

$$\frac{C4}{C1 + C2 + C3 + C4} \times \frac{(C5 \times S4 + C6 \times S5 + C7 \times S6)}{C5 + C6 + C7 + CTM' + CpL} \times V_{ref}$$

where CpM represents a parasitic capacity (F) of the upper output line 56b of the M-DAC 54, CpL a parasitic capacity (F) of the lower output line 56a of the L-DAC 52, CTL' an equivalent capacity of the L-DAC 52 relative to the output of the M-DAC 54, which is represented by the following equation:

$$CTL' = \frac{C4(C5 + C6 + C7 + CpL)}{C4 + (C5 + C6 + C7 + CpL)}, \text{ and}$$

CTM' an equivalent capacity of the M-DAC 54 relative to the output of the L-DAC 52, which is represented by the following equation:

$$CTM' = \frac{C4(C1 + C2 + C3 + C4 + CpM)}{C4 + (C1 + C2 + C3 + CpM)}$$

On this occasion, supposed that the capacities C3, C4 and C7 each has one unit capacity and the parasitic capacities CpL and CpM each has 0.2 unit capacity, the equation (4) is represented by the use of the following equation (5):

$$V_{out} = (1/66.24)\{(4 \times S1 + 2 \times S2 + 1 \times S3) + (1/8.2) \times (4 \times S4 + 2 \times S5 + 1 \times S6)\} \times V_{ref} \quad (5)$$

In the equation (5), the L-DAC 52 has 1/8.2 times the step size of the M-DAC 54, and the change of the analog output voltage thereof is not linear to the input digital signal. Therefore, in the above-mentioned conventional DA converter 50, so long as the upper and lower output lines 56a, 56b each has the parasitic capacity even if the lower capacitor 62a of the L-DAC 52 and the upper capacitor 62b of the M-DAC 54 are identical in unit capacity with each other, the waveform of the analog voltage outputted from the analog output terminal is distorted.

Further, the conventional DA converter 50 has a problem that the freedom of design is limited, for example, that the lower capacitor 62a of the L-DAC 52 and the upper capacitor 62b of the M-DAC 54 must be identical in unit capacity with each other.

On the other hand, when the capacitor of the L-DAC 52 is miniaturized, the capacity thereof is hard to be formed precisely. In order to form the capacity so as to correspond to the designed value precisely, the capacity of the lower capacitor 62a of the L-DAC 52 is required to be greater than the capacity of the upper capacitor 62b of the M-DAC 54. However, in the conventional construction, since the minimum capacity of the L-DAC 52 is the same as that of the M-DAC 54, the capacity of the miniaturized capacitor of the L-DAC 52 cannot be formed according to the designed value.

Consequently, it has been desired to provide a linear type digital-to-analog converter and a driving method therefor, having a construction of preventing from generation of parasitic capacity on the output, and of forming the unit capacity of the respective capacitors of the upper and lower digital-to-analog converter precisely according to the designed value.

It is therefore an object of the present invention to provide a linear type digital-to-analog converter which has a great freedom of design and then is not affected by a parasitic capacity.

SUMMARY OF THE INVENTION

The present invention provides a linear type digital-to-analog converter comprising a lower digital-to-analog converting portion having a plurality of lower serial circuits connected in a ladder manner between a lower output line, and an earthed line and a reference voltage line, the lower serial circuit comprising a lower capacitor having a weighted capacity and a lower transfer type switch, and a weighted second capacitor connected between the lower output line and the earthed line; and an upper digital-to-analog converting portion having a plurality of upper serial circuits connected in a ladder manner between an upper output line, and the earthed line and the reference voltage line, the upper serial circuit comprising an upper capacitor having a weighted capacity and an upper transfer type switch, the lower output line and the upper output line being connected through a coupling capacitor, wherein a buffer amplifier is disposed between the lower output line and the coupling capacitor.

From the above, the buffer amplifier is disposed between the lower output line and the coupling capacitor, which results in prevention of an interaction between the lower digital-to-analog converting portion and the upper digital-to-analog converting portion. Accordingly, the unit capacity of the capacitor in the lower digital-to-analog converting portion and the unit capacity of the capacitor in the upper digital-to-analog converting portion can be determined independently to each other. Furthermore, even if the upper and lower output lines each has the parasitic capacity, the output voltage of the upper digital-to-analog converting portion is not related to the parasitic capacity of the lower digital-to-analog converting portion, and only the ratio of the coupling capacity and the parasitic capacity of the upper digital-to-analog converting portion has a relationship to the output voltage of the lower digital-to-analog converting portion, which results in linearity of the analog voltage outputted from the analog output terminal compared with the input digital signal. Therefore, According to the present invention, even if the unit capacity of the capacitor in the lower digital-to-analog converting portion and the unit capacity of the capacitor in the upper digital-to-analog converting portion are determined independently to each other, the linear characteristic of the input/output of the digital-to-analog converting portion can be maintained satisfactorily, whereby the respective unit capacities can be set precisely and independently.

Preferably, the buffer amplifier is of a voltage follower type amplifier. Such a voltage follower type amplifier has a high input resistance and a low output resistance, which can sufficiently exhibit the function as the buffer. Accordingly, the unit capacity of the upper digital-to analog converting portion and the unit capacity of the lower digital-to analog converting portion can be set independently to each other, respectively.

Preferably, a first analog switch is disposed between the upper output line and the earthed line, a second analog switch is disposed in parallel with the second capacitor between the lower output line and the earthed line.

Since there are provided the first analog switch and the second analog switch, the digital-to-analog converter according to the present invention is prevented from being affected by the leak current form the external elements which are connected thereto.

Preferably, a plurality of the lower capacitors have different weights, and a plurality of the upper capacitors have different weights. Since the upper and lower capacitors have the weights different from each other, the waveform of the analog voltage which is linear relative to the input digital signal is taken out from the analog output terminal by setting the upper and lower transfer type switches to any one of the earthed line and the reference voltage line through the input digital signal.

Also, the present invention provides a method of driving a linear type digital-to-analog converter comprising a lower digital-to-analog converting portion having a plurality of lower serial circuits connected in a ladder manner between a lower output line, and an earthed line and a reference voltage line, the lower serial circuit comprising a lower capacitor having a weighted capacity and a lower transfer type switch, and a weighted second capacitor connected between the lower output line and the earthed line; an upper digital-to-analog converting portion having a plurality of upper serial circuits connected in a ladder manner between an upper output line, and the earthed line and the reference voltage line, the upper serial circuit comprising an upper capacitor having a weighted capacity and an upper transfer type switch, wherein a first analog switch is disposed between the upper output line and the earthed line, a second analog switch is disposed in parallel with the second capacitor between the lower output line and the earthed line, and the lower output line and the upper output line are connected through a coupling capacitor, the method comprising the steps of: at the time of t1, setting all of the upper and lower transfer type switches to connect the upper and lower transfer type switches to the earthed line, and turning on the first and second analog switches to connect the first and second analog switches to the earthed line; at the time of t2, turning off the second analog switch to disconnect the second analog switch from the earthed line; and then, at the time of t3, turning off the first analog switch to disconnect the first analog switch from the earthed line, and resetting the upper and lower transfer type switches to connect to the upper and lower transfer type switches to the reference voltage line.

From the above, according to the present invention, the first analog switch is kept being turned on until the time of t3 also after the second analog switch is turned off at the time of t2 and then this analog switch is disconnected from the earthed line, which results in prevention from the influence of the distortion in the waveform of the analog voltage which is generated from the offset voltage exposed when the second analog switch is turned off.

BRIEF DESCRIPTION OF THE DRAWINGS

Further object and advantages of the invention will be apparent from the following description of the preferred embodiment of the invention as illustrated in the accompanying drawings, in which.

DETAILED DESCRIPTION OF THE PREFERRED EMBODIMENTS

A linear type digital-to-analog converter and a driving method therefor according to the invention will now be described in detail with reference to the drawings showing an embodiment thereof. Incidentally, FIG. 1 shows merely a schematic arrangement of the respective constituent elements on such a level that the invention can be understood.

[The Construction of Linear Type Digital-to-Analog Converter]

The main construction of the linear type digital-to-analog converter (hereinafter referred to as "the DA converter") according to the invention will now be described in detail with reference to FIG. 1.

Figure 1:
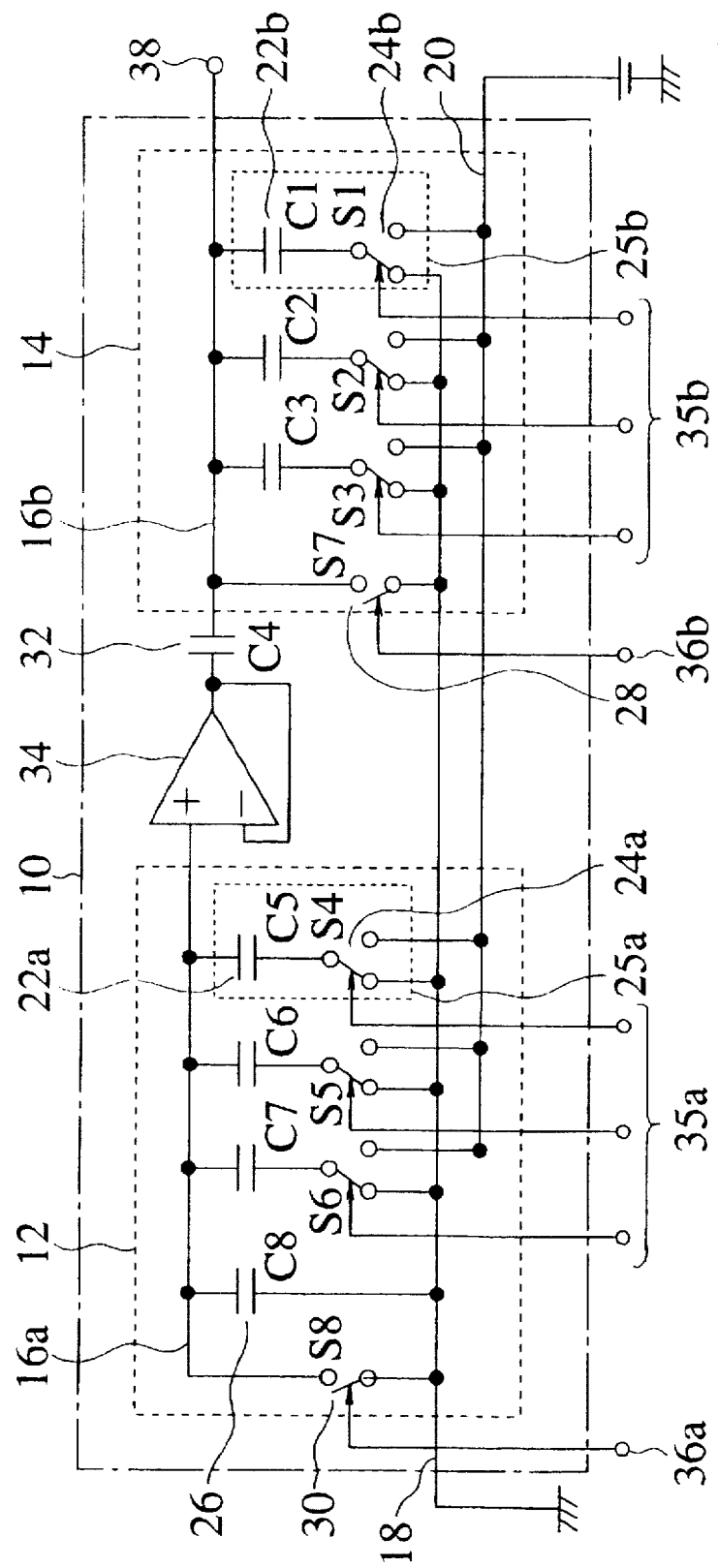
FIG. 1 is a circuit diagram of explaining the main construction of a linear type digital-to-analog converter according to the present invention.

Referring to FIG. 1, there is shown a circuit diagram of a 6-bits type DA converter according to an embodiment of this invention.

The DA converter 10 is comprised of a lower digital-to-analog converting portion (hereinafter referred to as "the lower DA converter portion") 12 and an upper digital-to-analog converting portion (hereinafter referred to as "the upper DA converter portion") 14.

The lower DA converter portion 12 has a plurality of lower serial circuits (i.e., respective serial circuits of C5 and S4, C6 and S5, and C7 and S6, then representatively shown by "reference numeral 25a") connected in a ladder manner between a lower output line 16a, and an earthed line 18 and a reference voltage line 20. The lower serial circuit 25a is comprised of a lower capacitor (C5, C6, and C7, then representatively shown by "reference numeral 22a") having a weighted capacity and a lower transfer type switch (S4, S5, and S6, then representatively shown by "reference numeral 24a"). On this occasion, in the lower serial circuit 25a, the lower transfer type switch (S4, S5, and S6) 24a is connected to the lower output line 16a through the lower capacitor (C5, C6, and C7) 22a, and then one changing terminal (set position) thereof is connected to the earthed line 18 and the other changing terminal (reset position) thereof is connected to the reference voltage line 20.

Further, a second capacitor (C8) 26 having a weighted capacity is disposed between the lower output line 16a and the earthed line 18, and a second analog switch (referred to as "the second reset switch" also) 30 is also disposed therebetween in parallel with the second capacitor 26.

In this embodiment, the lower capacitor (C5, C6, and C7) 22a and the second capacitor (C8) 26 have respective capacities different from each other. That is, the capacity C7 has a weight of "1", the capacity C6 has twice the weight of the capacity C7, and the capacity C5 has four times the weight of the capacity C7.

Besides, the second capacitor (C8) 26 has such a weight that the sum of the parasitic capacity of the lower output line 16a of the lower DA converter portion 12 and the capacity of the second capacitor (C8) 26 is identical with that of the lower capacitor (C7) 22a.

Incidentally, the lower transfer type switch (S4, S5, and S6) 24a will be described later together with the upper DA converter portion 14. Also, the second reset switch 30 aims to remove the leak current from the external elements connected to the DA converter 10.

The upper DA converter portion 14 has a plurality of upper serial circuits (i.e., respective serial circuits of C1 and S1, C2 and S2, and C3 and S3, then representatively shown by "reference numeral 25b") connected in a ladder manner between a upper output line 16b, and the earthed line 18 and the reference voltage line 20. The upper serial circuit 25b is comprised of an upper capacitor (C1, C2, and C3, then representatively shown by "reference numeral 22b") having a weighted capacity and an upper transfer type switch (S1, S2, and S3, then representatively shown by "reference numeral 24b"). On this occasion, in the upper serial circuit 25b, the upper transfer type switch (S1, S2, and S3) 24b is connected to the upper output line 16b through the upper capacitor (C1, C2, and C3) 22b, and then one changing terminal (set position) thereof is connected to the earthed line 18 and the other changing terminal (reset position) thereof is connected to the reference voltage line 20.

Further, a first analog switch (also referred to as "the first reset switch" also) 28 is also disposed between the upper output line 16b and the earthed line 18 in parallel with the upper serial circuit 25b.

The first reset switch 28 aims to remove the leak current from the external elements connected to the DA converter 10.

In this embodiment, the upper capacitors (C1, C2, and C3) 22b have respective capacities of different weights. That is, the capacity C3 has a weight of "1", the capacity C2 has twice the weight of the capacity C3, and the capacity C1 has four times the weight of the capacity C3.

In this embodiment is exemplified the 6-bits type DA converter, so that the input digital signal is of 6-bits, then both the upper transfer type switch (S1, S2, and S3) 24b and the lower transfer type switch (S4, S5, and S6) 24a constitute a switch of 6-bits (6 columns) as a whole. That is, the switches S1, S2, S3, S4, S5, and S6 correspond to from MSB to LSB in order. Accordingly, the switches S 1 to S6 each selectively connects to any one of the reference voltage line 20 and the earthed line 18 in response to the signal for the corresponding column of 6-bits of the input digital signal which is inputted through input digital signal terminals 35a and 35b.

A coupling capacitor (C4) 32 is connected between the lower output line 16a and the upper output line 16b, and then a buffer amplifier 34 is connected between the lower output line 16a and the coupling capacitor (C4) 32. Moreover, in this embodiment, the coupling capacitor 32 is also referred to as "the connecting capacitor". The coupling capacitor (C4) 32 has the capacity having the same weight as that of the upper capacitor (C3) 22b, i.e., the weight of "1".

The buffer amplifier 34 is preferably is of a voltage follower type amplifier. The buffer amplifier 34 has a high input resistance and a lower output resistance, so that the unit capacity of the lower DA converter portion 12 and the upper DA converter portion 14 can be set independently to each other, respectively. In this embodiment, a +input terminal of the buffer amplifier 34 is connected to the lower output line 16a, and an output terminal of the buffer amplifier 34 is connected to the coupling capacitor (C4) 32 and a −terminal thereof, respectively.

Since the above circuit construction of the DA converter according to the invention has the first and second analog switches 28, 30, the offset voltage is generated due to the leak of the pulse signal when the first and second analog switches 28, 30 each is turned off. In particular, the offset voltage generated when the second analog switch 30 of the lower DA converter portion 12 causes a step error, and brings about the cause of distorting the waveform of the analog voltage, which is not preferable. Therefore, in the driving method of the DA converter according to the invention, the timing of the switching operation of the switches S1 to S8 is devised so as not to be affected by the offset voltage generated when the second analog switch 30 of the lower DA converter portion 12 is turned off.

[Driving Method of DA Converter]

The driving method for the linear type digital-to-analog converter acceding to the invention will be now be described with reference to FIG. 1 and FIG. 2, which is exemplified by a case in which the 6-bits type input digital signal is processed. Accordingly, the DA converter 10 has, as described above with reference to FIG. 1, six sets of serial circuits 25a, 25b corresponding to respective columns of 6-bits. The serial circuits each is comprised of an input signal terminal (35a, 35b) to which is inputted the control signal for controlling the switch (24a, 24b) which constitutes the serial circuit. The total six signal terminals are assigned, in order, to signal levels of the respective bits of the input digital signal (i.e., the one operating as the above control signal) with a one-to-one correspondence therebetween.

Figure 2:
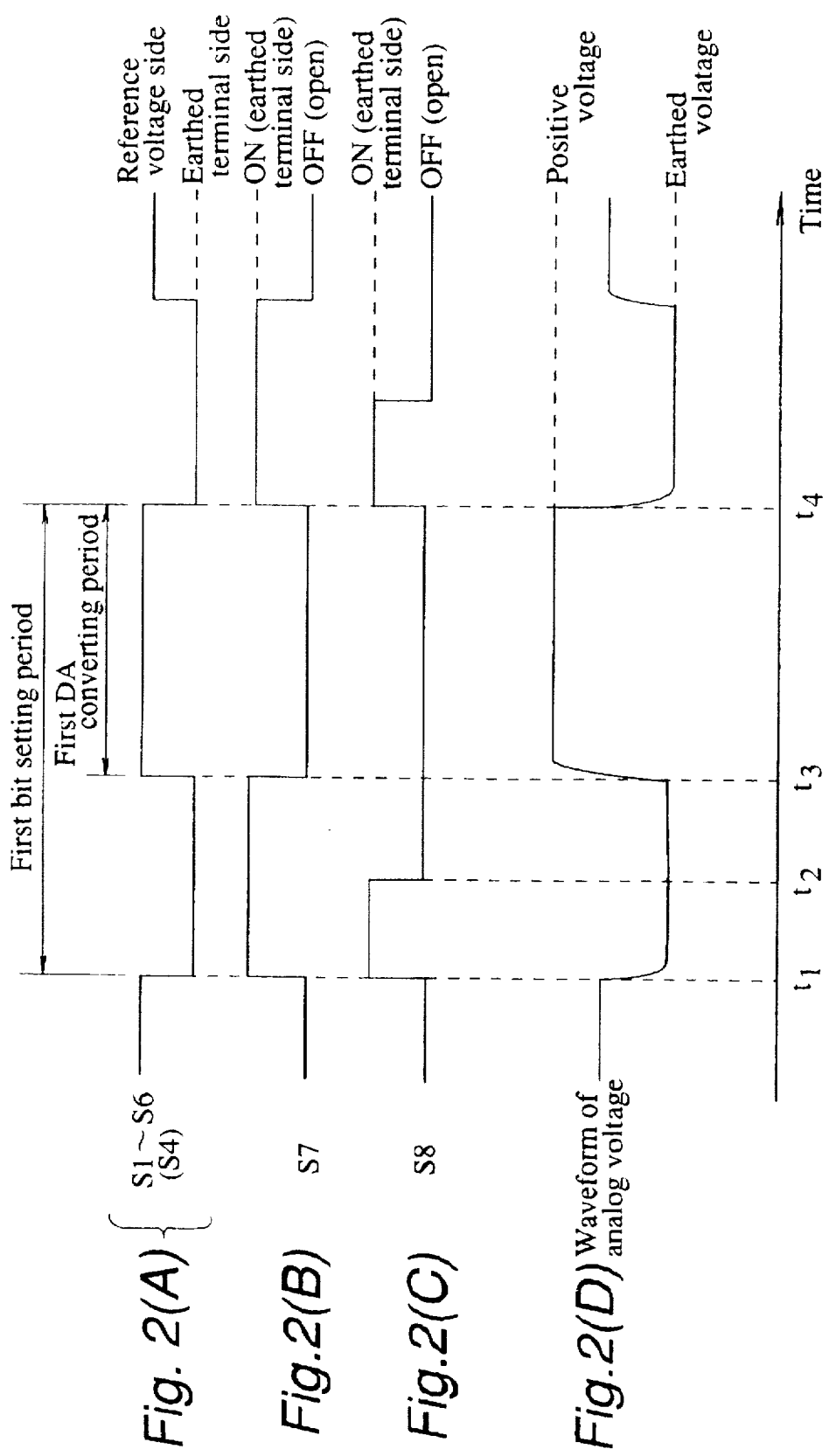
FIG. 2, which are comprised of FIGS. 2(A), 2(B), 2(C), and 2(D), is a timing chart of explaining a driving method for the linear type digital-to-analog converter, according to the present invention.
Figure 3:
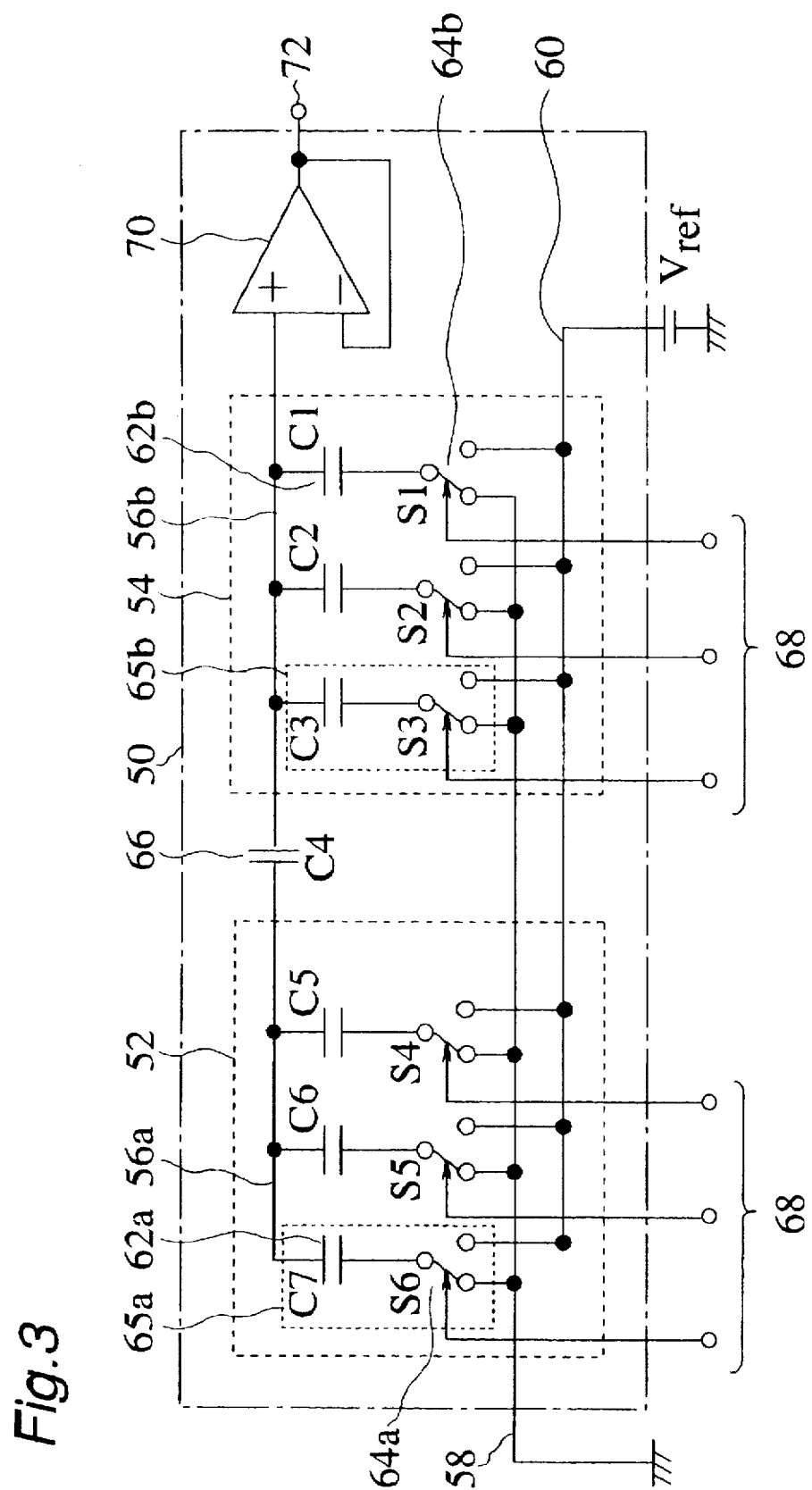
FIG. 3 is a circuit diagram of explaining the main construction of a conventional digital-to-analog converter.

Referring to FIG. 2, there is shown the timing chart diagram of explaining the driving method for the DA converter. In FIG. 2, (A) represents operations of the upper and lower transfer type switches (S1 to S6) 24a, 24b, (B) an operation of the first reset switch (S7) 28, (C) a operation of the second reset switch (S8) 30, and (D) a waveform of the analog voltage outputted from the analog output terminal 38. Moreover, in this embodiment, the upper and lower transfer type switches (S1 to S6) 24a, 24b will be referred to as "the switches S1 to S6".

In this driving method for the DA converter, there are set a discharging period (t2 to t3) during which the upper and lower capacitors 22a, 22b for constituting the DA converter 10 are discharged, for preventing an influence by the offset voltage of the second analog switch (S8) 30 connected to the DA converter 10.

The relationship between the operation of the switches S1 to S6 and the signals will now be described prior to the description of the discharging period. In the constitutional example described hereinbelow, each of the switches S1 to S6 is made to be of a set condition then connected to the earthed line 18 when the input digital signal is "0" in binary at the corresponding column thereof, whereas the switches S1 to S6 is made to be of a reset condition then connected to the reference voltage line 20 when the input digital signal is "1" in binary at the corresponding column thereof.

A first ON/OFF signal is applied to the first analog switch (S7) 28 from the ON/OFF signal terminal 36b. The first analog switch (S7) 28 is turned on (close) then connected to the earthed line 18 when the signal level of the first ON/OFF signal is "1" in binary, whereas the first analog switch (S7) 28 is turned off (open) then disconnected to the earthed line 18 when the signal level of the first ON/OFF signal is "0" in binary.

A second ON/OFF signal is applied to the second analog switch (S8) 30 from the ON/OFF signal terminal 36a. The second analog switch (S8) 30 is turned on (close) then connected to the earthed line 18 when the signal level of the second ON/OFF signal is "1" in binary, whereas the second analog switch (S8) 30 is turned off (open) then disconnected to the earthed line 18 when the signal level of the second ON/OFF signal is "0" in binary.

There will be now considered a case where the DA converter 10 is operated when the respective switches S1 to S6 and the signal condition have the above relationship. When the DA converter 10 is operated, there must be discharged an electric charge which is charged to the respective capacitors constituting the DA converter 10, by the leak current from the external elements (not shown) connected to the DA converter 10. Accordingly, the respective switches S1 to S6 are required to be connected to the earthed line 18, thereby being previously discharged. Furthermore, at the time of t1, the control signal of signal level "0" is applied to each of the input signal terminals 35a, 35b, whereby all the switches S1 to S6 are made to be of the set condition (time t1 in FIG. 2(A)).

Meanwhile, at the time of t1, the switches S1 to S6 are made to be set, and the first and second analog switches S7, S8 are supplied with the ON/OFF signals of signal level "1", so that these switches S7, S8 are turned on then connected to the earthed line 18 (time of t1 in FIG. 2(B) and FIG. 2(C)).

As described above, at the time of t1, all the switches S1 to S6 are made to be set, and the switches S7, S8 are turned on, accordingly, the leak current is sent to the earthed line 18 from the external elements connected to the DA converter 10, and the electric charges of the upper and lower capacitors (C1, C2, C3, C5, C6, and C7) 22a, 22b and the coupling capacitor (C4) 32 and the second capacitor (C8) 26 are discharged. Therefore, the analog voltage outputted form the analog output terminal 38 is made to be of the earthed voltage finally when the discharge progresses to be stopped (time of t1 and subsequent period in FIG. 2(D))

Next, at the time of t2, the switch S8 is turned off to be disconnected from the earthed line 18 (time of t2 in FIG. 2(C)). On this occasion, the offset voltage is generated when the switch S8 is turned off, so that the lower capacitor 22a and the second capacitor 26 are charged. In the same manner, this offset voltage charges the coupling capacitor 32 through the buffer amplifier 34. However, since the switch S7 is on an ON condition (the switch S7 is connected to the earthed line 18), the upper output line 16b is kept to be of the earthed voltage (time of t2 and the subsequent period) in FIG. 2(D)).

At the time of t3, a second ON/OFF signal of signal level "0" is applied to the switch S7 from the ON/OFF signal terminal 36b, whereby the switch S7 is turned off then disconnected from the earthed line 18. The second ON/OFF signal of signal level "0" exposed at the time of t3 is a start signal for starting the digital-to-analog converting of the input digital signal. Accordingly, at the same time of inputting of the start signal, the respective switches S1 to S6 are supplied with control signal of signal level of the corresponding column of the input digital signal through the corresponding terminals 35a, 35b, thereby starting the 6-bits type digital-to analog conversion.

In FIG. 2(A), a first DA converting period subsequent to the time of t3 exemplifies an example exposed when the signal level of the 6-bits type input digital signal at the fourth column from MSB is "1" and the switch S4 corresponding thereto is reset. Moreover, the time of t4 is a finish time of the digital-to-analog conversion, at which the condition exposed at the time of t1 is restored, thereby ensuring into the previously discharging period for the next cycle of the digital-to-analog conversion.

Therefore, the analog voltage is made positive during the period (t3 to t4) at which the digital-to-analog conversion is performed (period from t3 to t4 in FIG. 2(D)). Incidentally, in this embodiment, the period from t3 to t4 during which the digital-to-analog conversion is performed will also referred to as "the first DA period").

When the next digital-to-analog conversion is performed, the above-mentioned digital-to-analog converting operation during the period t1 to t4 is preferably performed repeatedly.

When the 6-bits type signal is inputted to the DA converter 10 to operate the respective switches S1 to S8 at the timing described with reference to FIG. 2 thereby performing the digital-to-analog conversion, the output voltage $V_{out}$ outputted to the analog output terminal 38 of the DA converter 10 is calculated by the use of the following equation (6):

$$V_{out} = \frac{(C1 \times S1 + C2 \times S2 + C3 \times S3)}{C1 + C2 + C3 + C4} \times V_{ref} + \frac{C4}{C1 + C2 + C3 + C4} \times \frac{(C5 \times S4 + C6 \times S5 + C7 \times S6)}{C5 + C6 + C7 + C8} \times V_{ref} \quad (6)$$

where $V_{ref}$ represents a reference voltage (V). In the equation (6), the first term of the right side represents the upper output voltage, and the second term thereof the lower output voltage.

As understood from the equation (6), the upper output voltage of the upper DA converter portion 14 is not related to the capacity of the lower DA converter portion 12, whereas the lower output voltage of the lower DA converter portion 12 is related to the ratio of the capacity of the upper DA converter portion 14 and the capacity of the coupling capacitor (C4) 32.

On this occasion, supposed the capacities C3, C4 each has one unit capacity, and that the capacity C7 has two unit capacities, the equation (6) is represented by the use of the following equation (7):

$$V_{out} = (1/8)\{(4 \times S1 + 2 \times S2 + 1 \times S3) + (1/8)(4 \times S4 + 2 \times S5 + 1 \times S6)\} \times V_{ref} \quad (7)$$

As understood by the equation (7), the lower DA converter portion 12 has 1/8 times the step size of the upper DA converter portion 14, and the change of the analog output voltage thereof is linear to the input digital signal.

Further, the upper and lower output lines 16a, 16b each has a parasitic capacity, the output voltage $V_{out}$ outputted to the analog output terminal 38 of the DA converter 10 is calculated by the use of the following equation (8):

$$V_{out} = \frac{(C1 \times S1 + C2 \times S2 + C3 \times S3)}{C1 + C2 + C3 + C4 + CpM} \times V_{ref} + \frac{C4}{C1 + C2 + C3 + C4 + CpM} \times \frac{(C5 \times S4 + C6 \times S5 + C7 \times S6)}{C5 + C6 + C7 + C8' + CpL} \times V_{ref} \quad (8)$$

where CpM represents a parasitic capacity (F) of the upper DA converter portion 14, CpL a parasitic capacity (F) of the lower DA converter portion 12, and C8' a capacity (F) in which the sum of the parasitic capacity of the lower DA converter portion 12 and the value C8' is identical with the value C7.

On this occasion, supposed that the capacities C3 and C4 each has one unit capacity and the capacity C7 has two unit capacity, the parasitic capacities CpM and CpL each has 0.2 unit capacity, the equation (8) is represented by the use of the following equation (9):

$$V_{out} = (1/2.2) \{(4 \times S1 + 2 \times S2 + 1 \times S3) + (1/8) \times (4 \times S4 + 2 \times S5 + 1 \times S6)\} \times V_{ref} \quad (9)$$

As understood by the equation (9), the lower DA converter portion 12 has 1/8 times the step size of the upper DA converter portion 14, and the change of the analog output voltage thereof is linear to the input digital signal.

As described above, even if the lower DA converter portion 12 is not identical in unit capacity with the upper DA converter portion 14, or even if the upper and lower output lines 16a, 16b each has the parasitic capacity, the change of the analog voltage outputted from the analog output terminal is made linear to the input digital signal, which results in prevention of the distortion of the waveform of the analog voltage.

Furthermore, in a case where the first and second reset switches are provided as exemplified by the DA converter 10 according to the invention, the offset voltage is generated due to the leakage of the pulse signal when the first and second rest switches each is turned off. For the purpose of preventing that, the period from t1 to t3 are set in the driving method according to the invention.

Therefore, as already described above, the lower capacitor (C5, C6, and C7) 22a and the second capacitor (C8) 26 are charged due to the offset voltage generated when the switch S8 is turned off, and the switch S7 is on the ON condition, so that the coupling capacitor (C4) 32 is also charged through the buffer amplifier 34. On this occasion, the analog voltage outputted from the analog output terminal 38 becomes the earthed voltage, which results in prevention of the influence by the offset voltage generated at the lower DA converter portion 12.

Moreover, at the first DA converting period (t3 to t4), the output voltage of the lower DA converter portion 12 is represented by the sum of the output voltage exposed due to the reference voltage of the switches S1 to S6 and the offset voltage. Then, the voltage change at the lower DA converter portion 12 during the first DA converting period (t3 to t4) is merely of an amount corresponding to the voltage change exposed due to the switches S4 to S6. Therefore, there can be obtained the analog output voltage which is not affected by the offset voltage, as the output voltage of the lower DA converter portion 12 outputted from the upper output line 16b through the coupling capacitor 32.

According to the driving method for the DA converter according to the invention, there is set the continuation period (t2 to t3) during which the switch S7 is being closed after the switch S8 is turned off, which results in prevention of the influence by the offset voltage generated when the switch S8 of the lower DA converter portion 12 is turned off.

Although the offset voltage is generated when the first reset switch 28 is turned off, the offset voltage is not directly related to the linearity of the DA converter, whereby the offset voltage generated when the first analog switch 28 is turned off can be substantially ignored.

The above explanation for the embodiment has been made as an example of the 6-bits type DA converter, however, it is without saying that it can be applied to the DA converter of a type of the bit number other than 6-bits.

As apparent from the above description, the linear type digital-to-analog converter according to the invention has a buffer amplifier between the lower DA converter portion and the coupling capacitor, the unit capacity of the upper DA converting portion and the unit capacity of the lower DA converting portion can be determined independently to each other. Accordingly, the unit capacity of the upper DA converting portion and the unit capacity of the lower DA converting portion are not required to be made identical with each other, which results in increase of the freedom of design.

Further, even if the upper output line and the lower output line each has the parasitic capacity, the unit capacity of the upper DA converting portion and the unit capacity of the lower DA converting portion can be determined independently to each other, which realizes the linear type digital-to-analog converter which is capable of preventing the distortion of the waveform of the analog voltage.

Besides, according to the driving method of the invention, there is set the continuation period (t2 to t3) during which the first analog switch is being closed after the second analog switch is turned off, i.e., period from t1 to t3 which results in prevention of the influence by the offset voltage generated when the second analog switch of the lower digital-to-analog converting portion is turned off.

Many widely different embodiments of the invention may be constructed without departing from the spirit and scope of the invention. It should be understood that the invention is not limited to the specific embodiments described in the specification, except as defined in the appended claims.

What is claimed is:

1. A linear type digital-to-analog converter comprising a lower digital-to-analog converting portion having a plurality of lower serial circuits connected in a ladder manner between a lower output line, and an earthed line and a reference voltage line, said lower serial circuit comprising a lower capacitor having a weighted capacity and a lower transfer type switch, and a weighted second capacitor connected between said lower output line and said earthed line; and an upper digital-to-analog converting portion having a plurality of upper serial circuits connected in a ladder manner between an upper output line, and said earthed line and said reference voltage line, said upper serial circuit comprising an upper capacitor having a weighted capacity and an upper transfer type switch, said lower output line and said upper output line being connected through a coupling capacitor, wherein a buffer amplifier is disposed between said lower output line and said coupling capacitor.

2. A linear type digital-to-analog converter as claimed in claim 1, wherein said buffer amplifier is of a voltage follower type amplifier.

3. A linear type digital-to-analog converter as claimed in claim 1, wherein a first analog switch is disposed between said upper output line and said earthed line, a second analog switch is disposed in parallel with said second capacitor between said lower output line and said earthed line.

4. A linear type digital-to-analog converter as claimed in claim 1, wherein a plurality of said lower capacitors have different weights, and a plurality of said upper capacitors have different weights.

5. A method of driving a linear type digital-to-analog converter comprising a lower digital-to-analog converting portion having a plurality of lower serial circuits connected in a ladder manner between a lower output line, and an earthed line and a reference voltage line, said lower serial circuit comprising a lower capacitor having a weighted capacity and a lower transfer type switch, and a weighted second capacitor connected between said lower output line and said earthed line; and an upper digital-to-analog converting portion having a plurality of upper serial circuits connected in a ladder manner between an upper output line, and said earthed line and said reference voltage line, said upper serial circuit comprising an upper capacitor having a weighted capacity and an upper transfer type switch, wherein a first analog switch is disposed between said upper output line and said earthed line, a second analog switch is disposed in parallel with said second capacitor between said lower output line and said earthed line, and said lower output line and said upper output line are connected through a coupling capacitor, said method comprising the steps of:

at the time of t1, setting all of said upper and lower transfer type switches to connect said upper and lower transfer type switches to said earthed line, and turning on said first and second analog switches to connect said first and second analog switches to said earthed line;

at the time of t2, turning off said second analog switch to disconnect said second analog switch from said earthed line;

and then, at the time of t3, turning off said first analog switch to disconnect said first analog switch from said earthed line, and resetting said upper and lower transfer type switches to connect to said upper and lower transfer type switches to said reference voltage line.

* * * * *